(12) United States Patent
Chen

(10) Patent No.: US 10,629,439 B1
(45) Date of Patent: Apr. 21, 2020

(54) METHOD FOR MINIMIZING AVERAGE SURFACE ROUGHNESS OF SOFT METAL LAYER FOR BONDING

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/365,703

(22) Filed: Mar. 27, 2019

(51) Int. Cl.
| | |
|---|---|
| *H01L 21/18* | (2006.01) |
| *H01L 23/00* | (2006.01) |
| *H01L 21/02* | (2006.01) |
| *H01L 21/321* | (2006.01) |

(52) U.S. Cl.
CPC ...... *H01L 21/187* (2013.01); *H01L 21/02664* (2013.01); *H01L 21/32115* (2013.01); *H01L 24/27* (2013.01); *H01L 2224/27002* (2013.01); *H01L 2224/27848* (2013.01); *H01L 2924/0105* (2013.01); *H01L 2924/01031* (2013.01); *H01L 2924/01047* (2013.01); *H01L 2924/01048* (2013.01); *H01L 2924/01049* (2013.01); *H01L 2924/01082* (2013.01); *H01L 2924/01083* (2013.01)

(58) Field of Classification Search
CPC .................. H01L 21/187; H01L 21/32115
See application file for complete search history.

(56) References Cited

U.S. PATENT DOCUMENTS

2004/0157407 A1* 8/2004 Tong ................. H01L 21/76251
438/455

* cited by examiner

*Primary Examiner* — Matthew L Reames
(74) *Attorney, Agent, or Firm* — CKC & Partners Co., LLC

(57) ABSTRACT

A method for minimizing an average surface includes: forming an epitaxial layer on a growth substrate; forming the soft metal layer on the epitaxial layer in which the average surface roughness of a bonding surface of the soft metal layer is greater than a first value; forming a glue layer on a carrier substrate; placing a combination of the glue layer and the carrier substrate on the bonding surface in which the glue layer being in contact with the bonding surface of the soft metal layer; and performing a laser lift-off process to separate the growth substrate from the epitaxial layer such that the average surface roughness of the bonding surface of the soft metal layer is reduced to be less than a second value. The second value is smaller than the first value, and the second value is less than 80 nm.

4 Claims, 8 Drawing Sheets

105

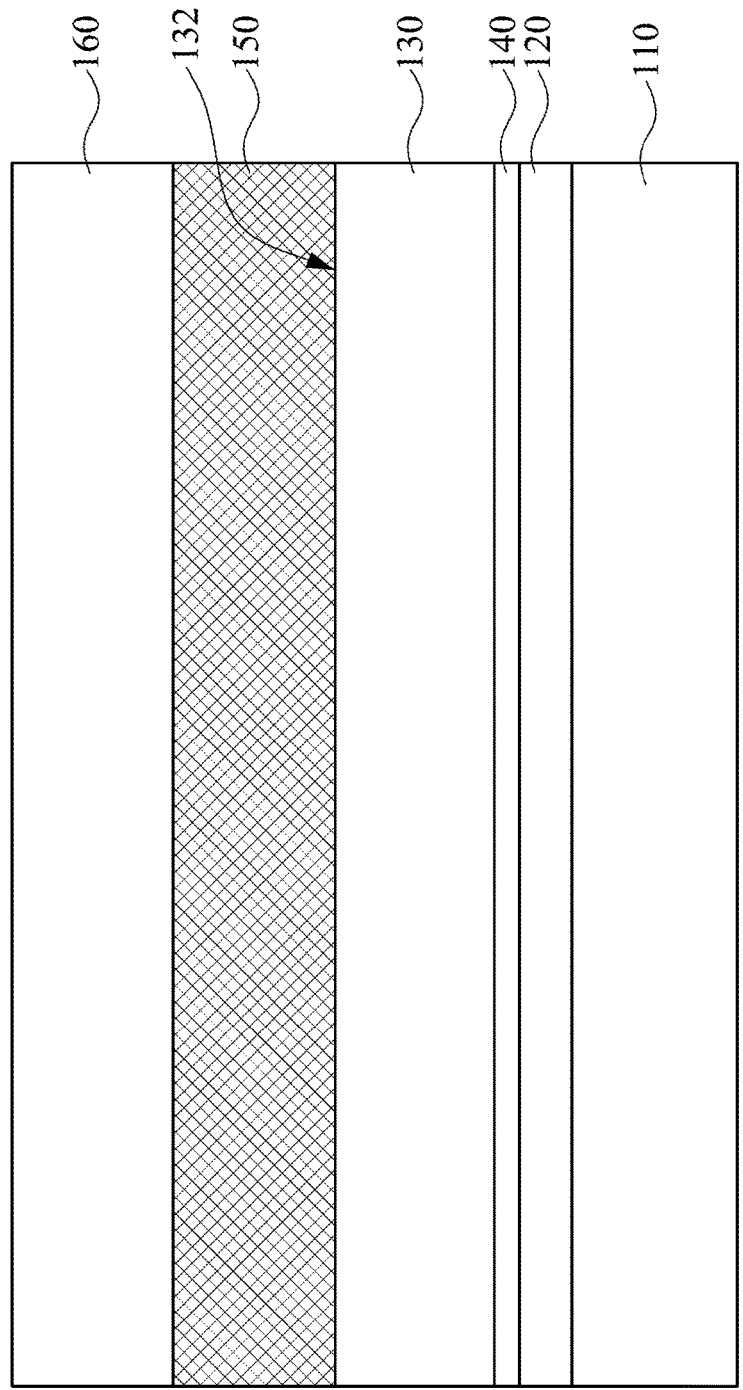

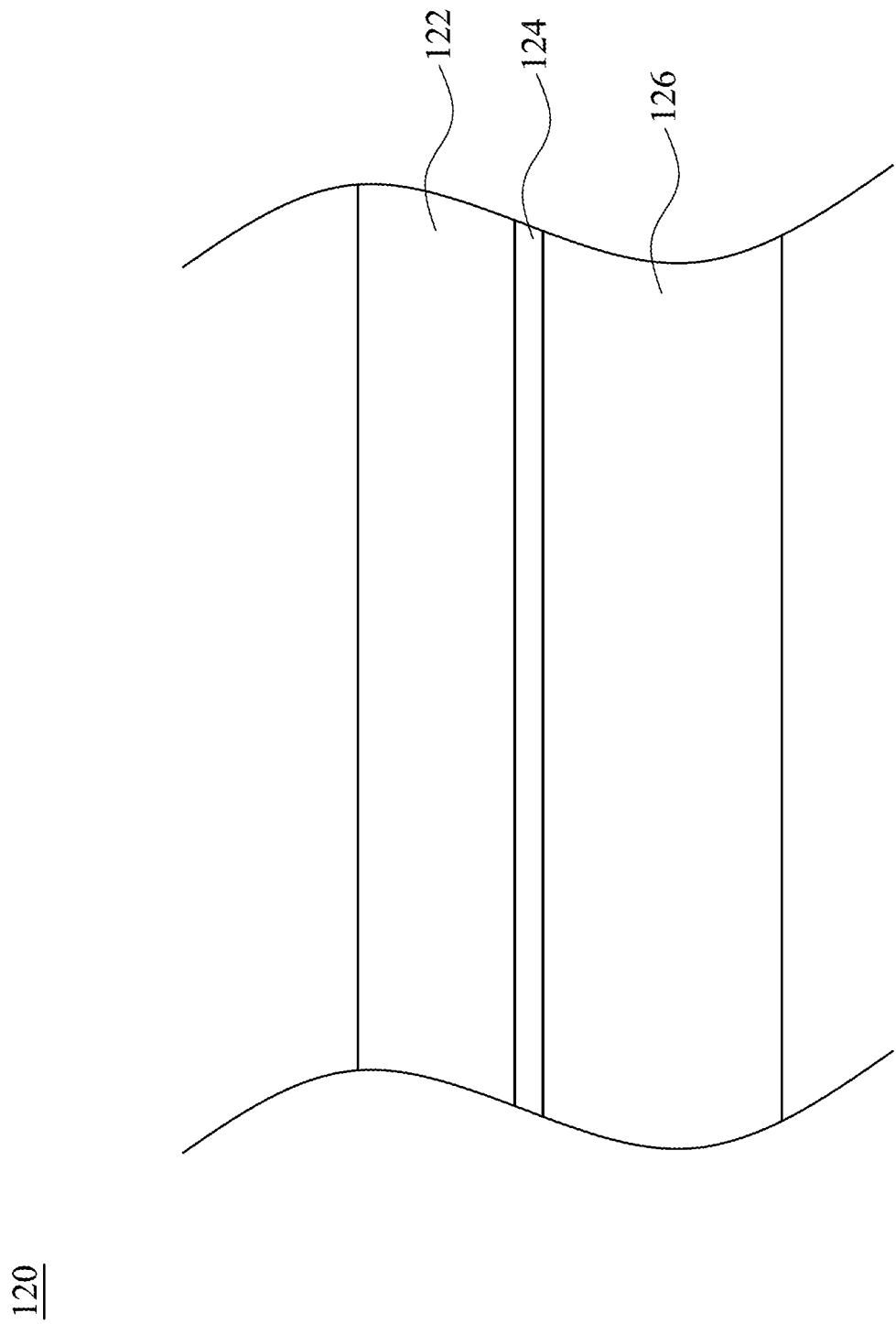

METHOD FOR MINIMIZING AVERAGE SURFACE ROUGHNESS OF SOFT METAL LAYER FOR BONDING

BACKGROUND

Field of Invention

The present disclosure relates to a method for minimizing an average surface roughness of a soft metal layer for bonding.

Description of Related Art

The statements in this section merely provide background information related to the present disclosure and do not necessarily constitute prior art.

In recent years, micro devices have become popular in various applications. Among all technical aspects of micro devices, one of the important issues is to explore novel and suitable bonding processes to bond a micro device to a target place such as a conductive pad or a substrate.

SUMMARY

According to some embodiments of the present disclosure, a method for minimizing an average surface roughness of a soft metal layer for bonding is provided. The method includes: forming an epitaxial layer on a growth substrate; forming a soft metal layer on the epitaxial layer in which a thickness of the soft metal layer is in a range from about 0.2 µm to about 2 µm, and the average surface roughness of a bonding surface of the soft metal layer is greater than a first value; forming a glue layer on a carrier substrate; placing a combination of the glue layer and the carrier substrate on the bonding surface of the soft metal layer in which the glue layer is in contact with the bonding surface of the soft metal layer; and performing a laser lift-off process to separate the growth substrate from the epitaxial layer such that the average surface roughness of the bonding surface of the soft metal layer is reduced to be less than a second value. The second value is smaller than the first value, and the second value is less than 80 nm.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2D is a schematic view of an intermediate stage of the method according to some embodiments of the present disclosure;

FIG. 3 is a schematic cross-sectional view of an epitaxial layer according to some embodiments of the present disclosure.

DETAILED DESCRIPTION

Figure 1:
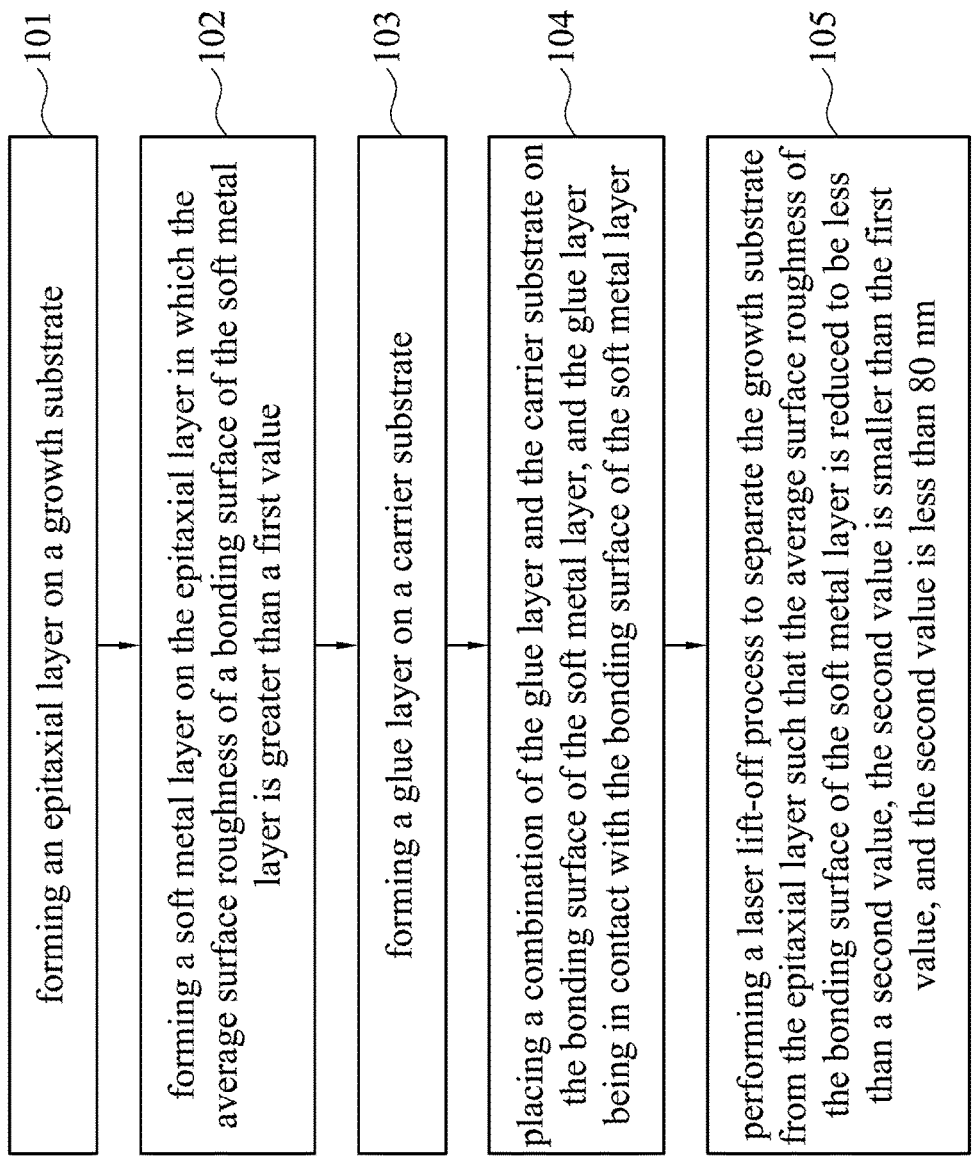
FIG. 1 is a schematic flow chart of a method for minimizing an average surface roughness of a soft metal layer for bonding according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIG. 1 and FIGS. 2A to 2E. FIG. 1 is a schematic flow chart of a method 100 for minimizing an average surface roughness of a soft metal layer for bonding according to some embodiments of the present disclosure. FIGS. 2A to 2E are schematic views of intermediate stages of the method 100 according to some embodiments of the present disclosure. In some embodiments, the method 100 for minimizing an average surface roughness of a soft metal layer for bonding is provided. The method 100 begins with an operation 101 in which an epitaxial layer 120 is formed on a growth substrate 110 (also referred to FIG. 2A). The method 100 continues with an operation 102 in which the soft metal layer 130 is formed on the epitaxial layer 120 (also referred to FIG. 2B). The method 100 continues with an operation 103 in which a glue layer 150 is formed on a carrier substrate 160 (also referred to FIG. 2C). The method 100 continues with an operation 104 in which a combination of the glue layer 150 and the carrier substrate 160 is placed on a bonding surface 132 of the soft metal layer 130 (also referred to FIG. 2D). The method 100 continues with an operation 105 in which a laser lift-off process LLO is performed to separate the growth substrate 110 from the epitaxial layer 120 (also referred to FIG. 2E).

Figure 2A:
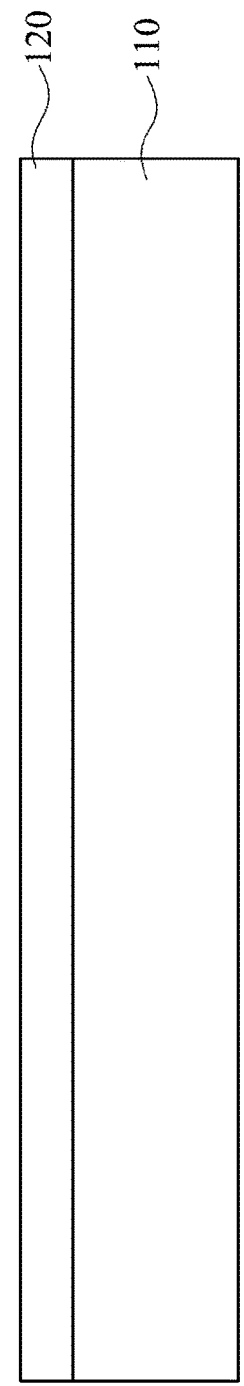
FIG. 2A is a schematic view of an intermediate stage of the method according to some embodiments of the present disclosure.

Reference is made to FIG. 2A in which the epitaxial layer 120 is formed on the growth substrate 110, and is also made to FIG. 3. FIG. 3 is a schematic cross-sectional view of the epitaxial layer 120 according to some embodiments of the present disclosure. In some embodiments, the epitaxial layer 120 includes a first type semiconductor layer 126, an active layer 124, and a second type semiconductor layer 122. In some embodiments, the first type semiconductor layer 126 is present on the growth substrate 110. In some embodiments, the active layer 124 is present on the first type semiconductor layer 126. In some embodiments, the second type semiconductor layer 122 is joined with the first type semiconductor layer 126 through the active layer 124. In some embodiments, the second type semiconductor layer 122 is a p-type semiconductor layer, but should not be limited thereto. In some embodiments, the first type semiconductor layer 126 is an n-type semiconductor layer, but should not be limited thereto.

Figure 2B:
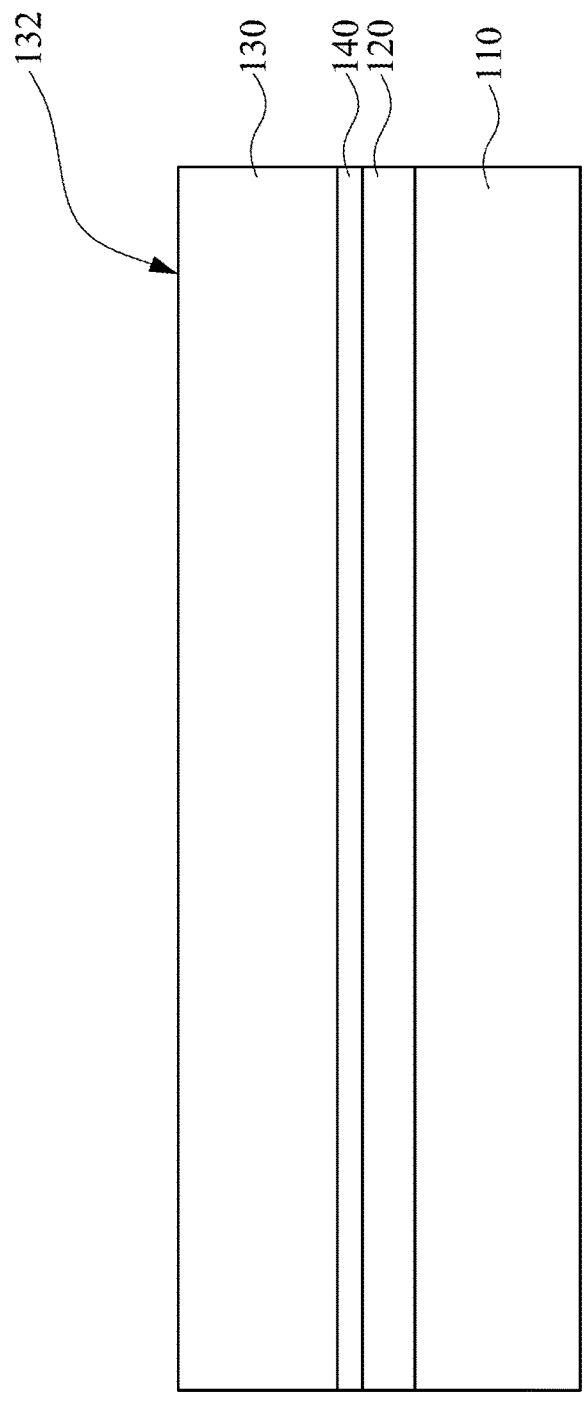
FIG. 2B is a schematic view of an intermediate stage of the method according to some embodiments of the present disclosure.

Reference is made to FIG. 2B in which the soft metal layer 130 is formed on the epitaxial layer 120. In some embodiments, a thickness of the soft metal layer 130 is in a range from about 0.2 μm to about 2 μm, and the average surface roughness of a bonding surface 132 of the soft metal layer 130 is greater than a first value. In some embodiments, a preferable thickness of the soft metal layer 130 is in a range from about 0.3 μm to about 1 μm. If the thickness of the soft metal layer 130 is too thin, the soft metal layer 130 may be too thin for bonding (e.g., too thin for performing an interstitial diffusion, which will be described later). If the thickness of the soft metal layer 130 is too thick, the time for depositing the soft metal layer 130 will be too long and greatly increase the cost. In addition, a film polish is too expensive to be performed to reduce the average surface roughness of the bonding surface 132 of the soft metal layer 130 when the thickness of the soft metal layer 130 is in a range from about 0.2 μm to about 2 μm. In some embodiments, the first value is greater than 80 nm. In some embodiments, the soft metal layer 130 includes at least one of indium (In), tin (Sn), lead (Pb), bismuth (Bi), Gallium (Ga), silver (Ag), and cadmium (Cd), or combinations thereof. The soft metal layer 130 can be formed by electron gun deposition (e-gun), sputtering, chemical plating (electroless plating), or electroplating. In some embodiments, an adhesive layer 140 is formed on the epitaxial layer 120 before the formation of the soft metal layer 130. The adhesive layer 140 is used for better adhesion of the soft metal layer 130 on the epitaxial layer 120. The adhesive layer 140 may include chromium (Cr), titanium (Ti), or a combination thereof, but should not be limited thereto.

Figure 2C:
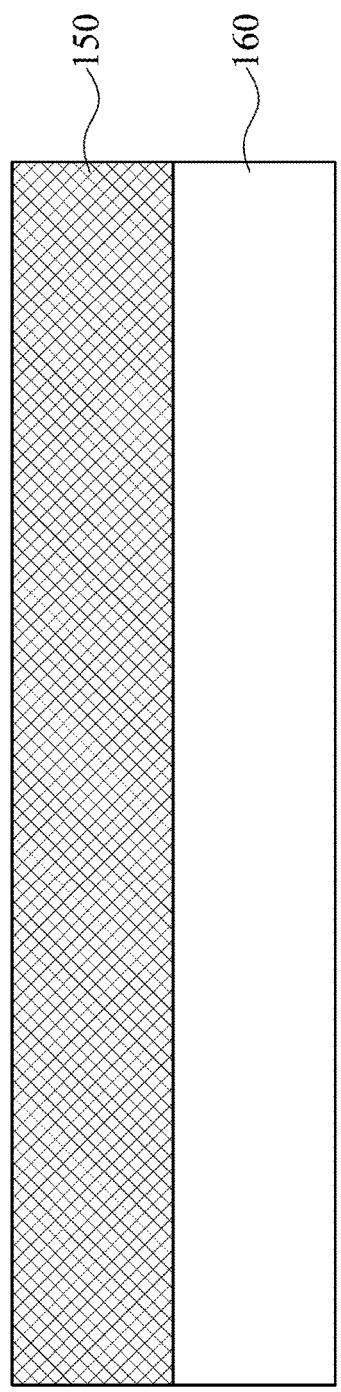
FIG. 2C is a schematic view of an intermediate stage of the method according to some embodiments of the present disclosure.

Reference is made to FIGS. 2C and 2D in which the glue layer 150 is formed on the carrier substrate 160, and the combination of the glue layer 150 and the carrier substrate 160 is placed on a bonding surface 132 of the soft metal layer 130. In some embodiments, the glue layer 150 is in contact with the bonding surface 132 of the soft metal layer 130. In some embodiments, the glue layer 150 is an ultra-violet glue layer.

Figure 2E:
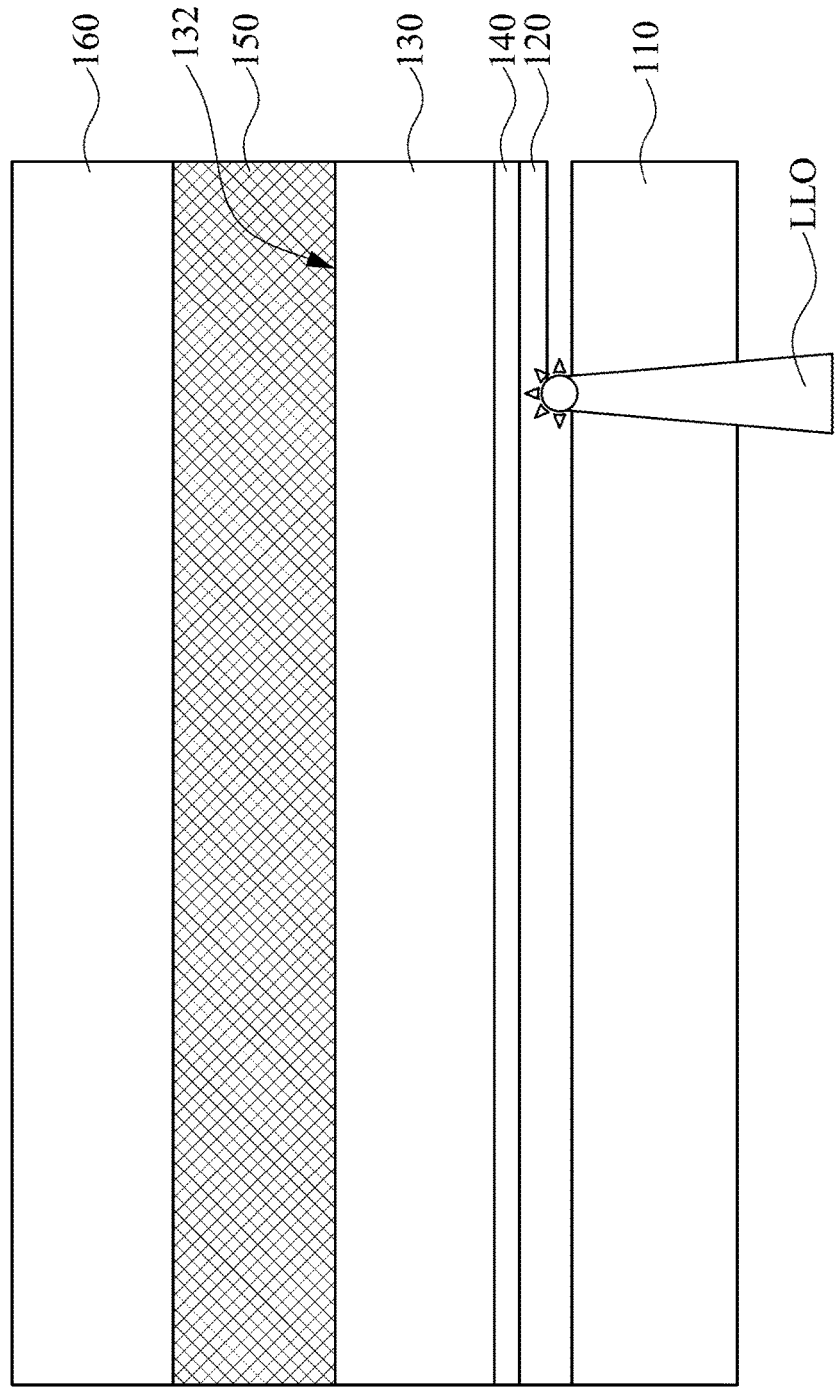
FIG. 2E is a schematic view of an intermediate stage of the method according to some embodiments of the present disclosure.
Figure 4:
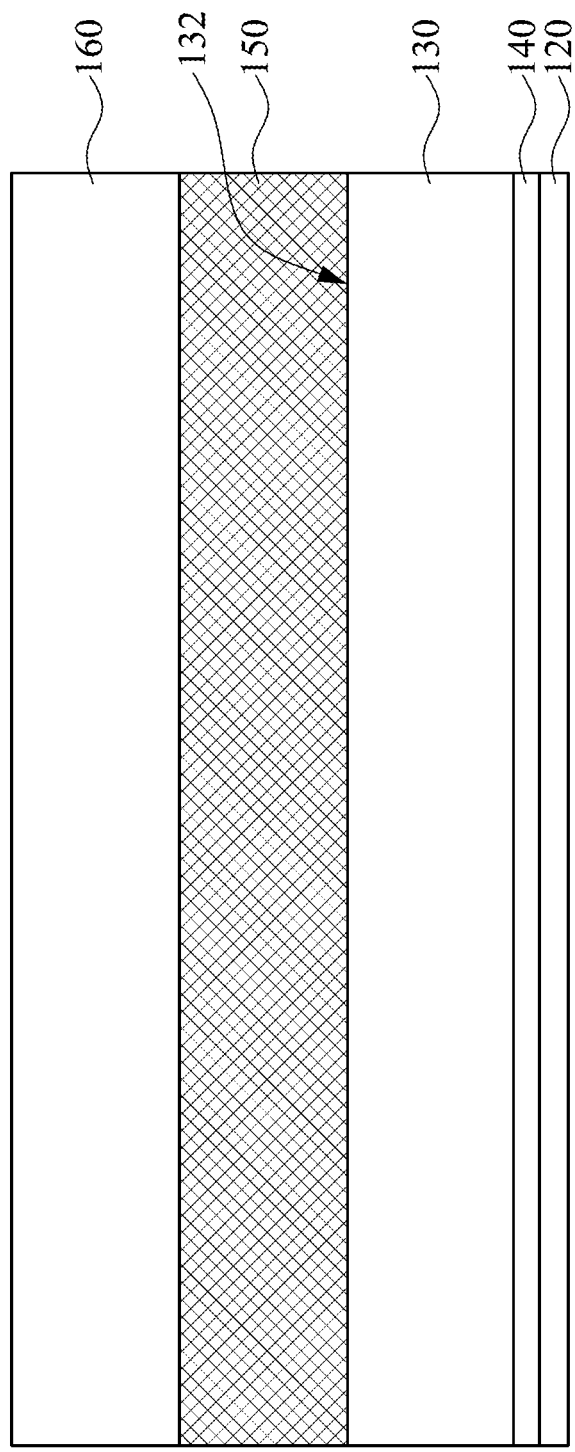
FIG. 4 is a schematic view illustrating a next stage of the structure shown in FIG. 2E after the laser lift-off process is performed and the growth substrate is separated from the epitaxial layer.

Reference is made to FIGS. 2E and 4 in which the laser lift-off process LLO is performed to separate the growth substrate 110 from the epitaxial layer 120. FIG. 4 is a schematic view illustrating a next stage of the structure shown in FIG. 2E after the laser lift-off process LLO is performed and the growth substrate 110 is separated from the epitaxial layer 120. In some embodiments, after the laser lift-off process LLO is performed to separate the growth substrate 110 from the epitaxial layer 120, the average surface roughness of the bonding surface 132 of the soft metal layer 130 is reduced to be less than a second value. The second value is smaller than the first value due to a pressure induced by shock waves and heat produced during said laser lift-off process LLO on the bonding surface, which slightly melts and smoothens the soft metal layer 130 with an assistance of the glue layer 150. In some embodiments, the second value is less than 80 nm. In some embodiments, the second value is less than 50 nm.

The above "roughness reduction" effect is of great help for various kinds of manufacturing processes after the laser lift-off process LLO, such as a micro-bonding process performed to bond a portion of a combination of the soft metal layer 130, the adhesive layer 140, and the epitaxial layer 120 to another substrate with a conductive pad (e.g., a copper pad) thereon, in which the bonding surface 132 is in contact with said conductive pad. Said micro-bonding process may be performed after said combination is chipped into a plurality of combinations each containing a portion of the soft metal layer 130, a portion of the adhesive layer 140, and a portion of the epitaxial layer 120. In some embodiments, said micro-bonding process is aimed at bonding a micro device with a lateral length less than or equal to about 100 μm. The roughness reduction is crucial since in the micro-bonding process a good quality of bonding is preferred to be conducted by an interstitial diffusion between the soft metal layer 130 and the conductive pad instead of melting the soft metal layer 130. Therefore, an amount of area of real contact parts between the soft metal layer 130 and the conductive pad when the soft metal layer 130 is placed onto the conductive pad is important for a good quality of bonding made by the interstitial diffusion. The roughness of the bonding surface 132 lower than 80 nm (or preferably lower than 50 nm) is qualified for said micro-bonding process. Besides, if the thickness of the soft metal layer 130 is too thin, a bonding force formed by the interstitial diffusion will be too weak to bond the soft metal layer 130 to the conductive pad. In some other embodiments, said micro-bonding process further includes a liquid assisted binding before the occurrence of said interstitial diffusion. Specifically, a liquid (e.g. water) is present between the soft metal layer 130 and said conductive pad after or before the soft metal layer 130 is placed onto the conductive pad. After that, the liquid is evaporated and then said interstitial diffusion occurs to bond the soft metal layer 130 to the conductive pad via an adequate heating. Said roughness of the bonding surface 132 which is lower than 80 nm is also important for the liquid assisted binding since the lower the roughness of the bonding surface 132, the more liquid (i.e., water) present between the soft metal layer 130 and the conductive pad can be in contact with both the soft metal layer 130 and the conductive pad so as to enhance a quality of the liquid assisted binding due to higher contact area between the conductive pad and the bonding surface 132 through the liquid during evaporation.

It should be mentioned that in a mass production manufacturing, the efficiency is important in every process, including the deposition process. As a result, extremely low deposition rate method (which usually leads to lower roughness) such as a molecular beam epitaxy (MBE) and an atomic layer deposition (ALD) are not suitable for the mass production manufacturing. Preferred methods may include electron gun deposition (e-gun), sputtering, chemical plating (electroless plating), or electroplating. However, these methods may not guaranteed to produce the bonding surface 132 with the roughness lower than 80 nm. In order to reach the desirable roughness of the bonding surface 132, the above-mentioned glue layer 150 and said laser lift-off process LLO provides a suitable pressure to smoothen the bonding surface 132.

In summary, the embodiments of the present disclosure provide a method for minimizing an average surface roughness of a soft metal layer for bonding. A glue layer and a laser lift-off process LLO are present to provide a suitable pressure to smoothen a roughness of a bonding surface of the soft metal layer such that the bonding surface can act as a better interface for a following micro-bonding process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for minimizing an average surface roughness of a soft metal layer for bonding, comprising:

forming an epitaxial layer on a growth substrate;

forming the soft metal layer on the epitaxial layer, wherein a thickness of the soft metal layer is in a range from about 0.2 µm to about 2 µm, and the average surface roughness of a bonding surface of the soft metal layer is greater than a first value;

forming a glue layer on a carrier substrate;

placing a combination of the glue layer and the carrier substrate on the bonding surface of the soft metal layer, and the glue layer being in contact with the bonding surface of the soft metal layer; and performing a laser lift-off process to separate the growth substrate from the epitaxial layer such that the average surface roughness of the bonding surface of the soft metal layer is reduced to be less than a second value, wherein the second value is smaller than the first value, and the second value is less than 80 nm.

2. The method of claim 1, wherein the epitaxial layer comprises:

a first type semiconductor layer present on the growth substrate;

an active layer present on the first type semiconductor layer; and a second type semiconductor layer joined with the first type semiconductor layer through the active layer.

3. The method of claim 1, further comprising:

forming an adhesive layer on the epitaxial layer before forming the soft metal layer.

4. The method of claim 1, wherein the soft metal layer comprises at least one of indium (In), tin (Sn), lead (Pb), bismuth (Bi), Gallium (Ga), silver (Ag), and cadmium (Cd).

* * * * *